United States Patent [19]

Weber et al.

[11] Patent Number: 5,725,140
[45] Date of Patent: Mar. 10, 1998

[54] TAPE FEEDER FOR A SURFACE MOUNT PLACEMENT SYSTEM

[75] Inventors: Jerome L. Weber; George M. Wohlhieter, both of Escondido, Calif.

[73] Assignee: Amistar Corporation, San Marcos, Calif.

[21] Appl. No.: 708,852

[22] Filed: Sep. 9, 1996

[51] Int. Cl.$^6$ .......................... B65H 20/00; B65H 23/00; B65G 65/04

[52] U.S. Cl. .......................... 226/139; 226/62; 226/128; 226/132; 242/566; 414/416

[58] Field of Search .......................... 226/62, 128, 129, 226/132, 133, 139, 157; 414/416

[56] References Cited

U.S. PATENT DOCUMENTS

| | | | |
|---|---|---|---|
| 4,740,136 | 4/1988 | Asai et al. | 414/16 X |
| 4,887,778 | 12/1989 | Soth et al. | 226/139 X |
| 4,952,113 | 8/1990 | Fujioka | 414/416 |
| 5,020,959 | 6/1991 | Soth | 414/416 |
| 5,294,035 | 3/1994 | Asai et al. | 226/157 |
| 5,299,902 | 4/1994 | Fujiwara et al. | 414/416 |
| 5,323,528 | 6/1994 | Baker | 29/721 |
| 5,328,317 | 7/1994 | Masui et al. | 414/403 |
| 5,419,802 | 5/1995 | Nakatsuka et al. | 414/416 X |
| 5,531,859 | 7/1996 | Lee et al. | 226/139 X |
| 5,588,614 | 12/1996 | Takada et al. | 226/139 X |

*Primary Examiner*—Michael Mansen
*Attorney, Agent, or Firm*—Baker, Maxham, Jester & Meador

[57] ABSTRACT

A tape feeder for advancing a carrier tape with pockets containing parts in a surface mount placement system enhances the precision and reliability with which the tape is advanced and reduces the risk of loss of parts in uncovered pockets due to vibration by provision of a sprocket wheel to advance the tape, a reciprocating shutter to retain parts in uncovered pockets, and a retaining member disposed above an edge of the tape for contacting a portion of a top surface of the tape to retain the top surface portion in a plane when the tape is engaged by the sprocket wheel. The operation of the retaining member is assisted by a guide member including front and rear guides that contact the top surface of the tape and a support block that is pressed by a support spring against the bottom surface of a portion of tape between the front and rear guides. The operation of the tape feeder is adjusted to accommodate different pitches.

22 Claims, 8 Drawing Sheets

TAPE FEEDER FOR A SURFACE MOUNT PLACEMENT SYSTEM

BACKGROUND OF THE INVENTION

1. Field of the Invention

This invention relates to a tape feeder for conveying parts to a location where they are picked by a vacuum quill for placement on a substrate, and particularly to a tape feeder that reliably advances a tape providing parts to a pick location in a surface mount placement system.

2. Description of the Related Art

U.S. Pat. No. 5,323,528 describes a surface mount placement system (SMPS) that automatically mounts parts onto substrates by automated means. The parts include, for example, electronic and electrical components, while substrates may comprise, for example, printed circuit boards (PCB). U.S. Pat. No. 5,323,528, which is assigned to the assignee of this application, is incorporated herein by reference.

The '528 patent discloses an SMPS in which parts are temporarily attached by a vacuum to the tip of a vacuum quill and held. The attachment and holding are referred to collectively as "picking". The picked electronic components are transferred by the SMPS to a substrate, where the vacuum is released to "place" the electronic component in a predetermined bonding position for bonding to the substrate.

In the SMPS, the parts that are picked and placed must be quickly and reliably transported to a pick location. Typically for this purpose, parts are packaged in elongate strips of carrier tape characterized in having a sequence of wells or pockets, in each of which a part is disposed. For efficient packaging and transport, a cover tape is attached to the top surface of a carrier tape to retain the parts in the pockets, and the tape is collected on a reel. At the SMPS, the reel is loaded into a tape feeder that grasps and unreels the tape, advancing it past a first location where the cover tape is removed and then past a second location where each part is picked out of its respective pocket for transport to and placement on a substrate.

In the industry, carrier tape characteristics have been standardized as to width and pitch. The width of the tape is taken from edge to edge: the standard widths are 8 mm, 12 mm, 16 mm, 24 mm, 32 mm, 44 mm, and 56 mm. Pitch is the spacing from pocket to pocket, and it varies with pocket size and tape width. For example, 8 mm tape may have a pitch of 2 mm or 4 mm; 12 mm tape may have a pitch of 4 8 mm, and so on. With reference to a tape feeder, the terms "pitch" and "stroke length" are interchangeable.

In operation, a tape feeder intermittently advances a carrier tape through a pick location after peeling off the cover tape. In the prior art, tape advancement is by positively-stopped advancing means that unreliably engage the tape, frequently requiring realignment between the tape and the advancing means. Further, the cover tape is removed several pockets in advance of the pick location. At least one pocket may be entirely uncovered during feeder operation. The tape feeder typically integrates a number of interlocked linkages that are repeatedly struck by an SMPS actuator. Therefore, at least one part in at least one exposed pocket at the pick location is at risk of being dislodged by vibrations imparted to the carrier tape that result from operation of the tape feeder. Manifestly, the reliability of a tape feeder would be enhanced by reliable advancement of the tape and by reduction or elimination of vibration of an open pocket containing a part at a pick location.

Typically a tape feeder handles a single width of tape with all possible pitches defined by known specifications. To date, however, 8 mm tape feeders are capable of handling only one pitch. Consequently, the inventory of 8 mm tape feeders includes redundancies for 2 mm and 4 mm pitch tapes. Manifestly, the expense and size of inventory for an SMPS would be significantly reduced with provision of an 8 mm tape feeder capable of handling 2 mm and 4 mm pitch tapes.

SUMMARY OF THE INVENTION

This invention is a tape feeder that reliably advances a carrier tape while reducing vibration of an uncovered portion of the carrier tape in which parts are cradled for transport through a pick location and accommodates a plurality of pitches for a particular tape width, including 8 mm.

The tape feeder of the invention, which is operable in a surface mount placement system (SMPS), provides parts contained in a carrier tape having two edges, a top surface and a bottom surface, a sequence of pockets for carrying the parts, and a cover tape applied to the top surface. The tape feeder includes a lever reciprocateable between two positions and including a cam with two surfaces. A sprocket wheel with teeth is provided for engaging the tape. A first reciprocateable linkage with a ratchet link in driving engagement with the sprocket wheel is interlocked with the lever for rotating the sprocket wheel to advance the tape when the lever is moved to a first position. The tape feeder includes a shutter for contacting the top surface to retain parts in uncovered pockets. A second reciprocateable linkage is provided in interlocking engagement with the lever. The second linkage includes a cam follower engaged by a first surface of the cam to move the shutter with the tape when the lever is moved to the first position, and engaged by a second surface of the cam to return the shutter when the lever is moved to a second position. A member is disposed laterally of the shutter, above an edge of the tape, for contacting the top surface to retain a portion of the top surface in a plane when the tape is moved by the sprocket wheel.

The sprocket wheel reliably advances the carrier tape by maintaining a continuous, noninterrupted driving engagement with the bottom surface of the carrier tape. The member ensures a positive engagement of sprocket holes in the tape with teeth of the sprocket wheel by retaining the top surface of the tape in a plane through which the sprocket wheel teeth rotate to advance the tape.

The cam in the lever engages the cam follower to provide a smooth, positive opening and closing of the shutter, thereby eliminating a positive shutter stop that would generate vibration as a consequence of shutter operation. In retaining the portion of the top surface adjacent an open pocket from which the next part is to be picked in the plane through which the sprocket teeth rotate, the member also contributes to elimination of vibration.

The pitch adjustment is provided in the invention by a positionable means to change the stroke length of the rather link in driving engagement with the sprocket wheel. At a first position of the positionable means, the stroke length rotates the sprocket wheel through a first arc that advances the carrier tape by an amount equal to a first pitch; at a second position, the stroke length of the rachet link rotates the sprocket wheel by an amount that advances the carrier tape a distance equal to a second pitch.

A second means is provided to adjust the amount by which the shutter travels. In a first position, the second means moves the shutter through a reciprocating path of travel that retains a part in an uncovered pocket for a first tape pitch; in a second position, the reciprocating path of travel of the shutter retains a part in a pocket for a tape having a second pitch.

The elimination of vibration and the pitch adjustment of the tape feeder embodied in this invention will be better appreciated and understood when the following detailed description is read with reference to the below-described drawings.

DETAILED DESCRIPTION OF THE PREFERRED EMBODIMENTS

Figure 1:
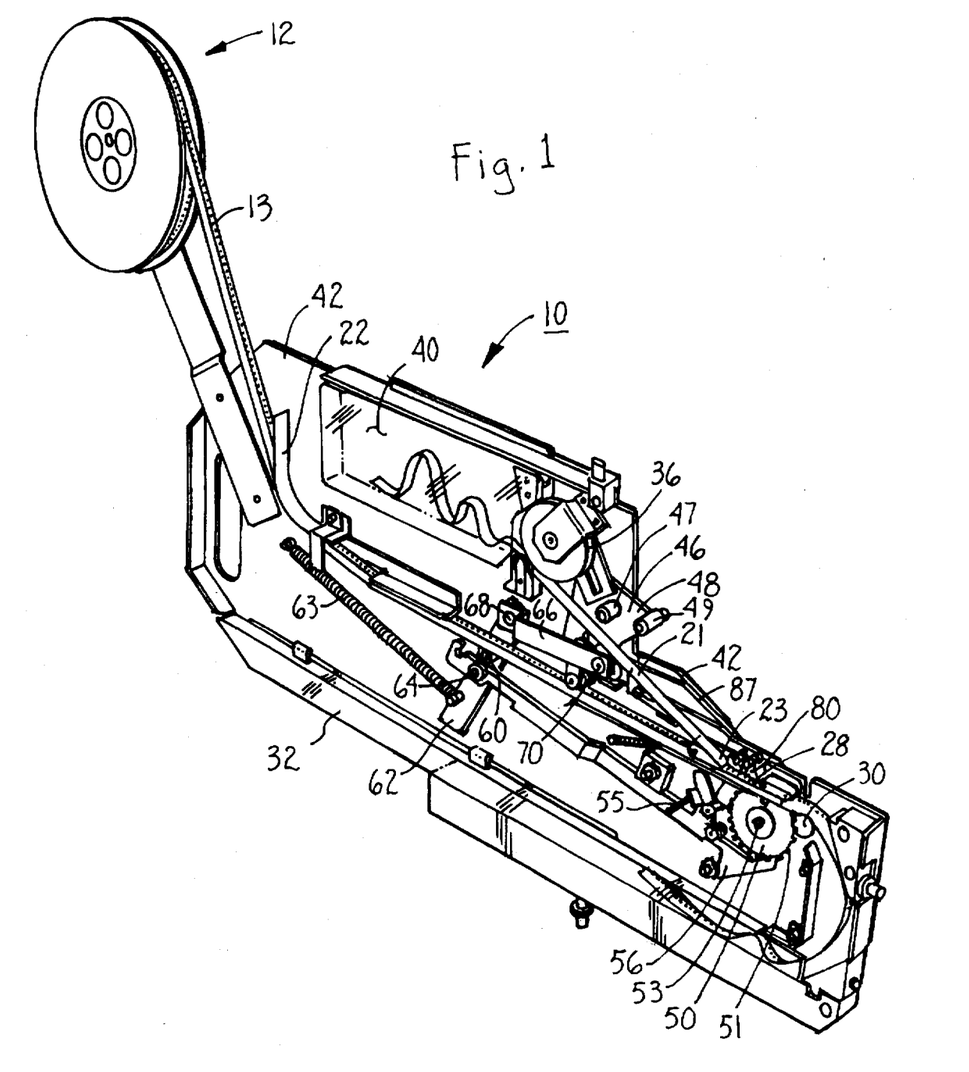
FIG. 1 is a perspective view illustrating a tape feeder embodying the principles of this invention.
Figure 2:
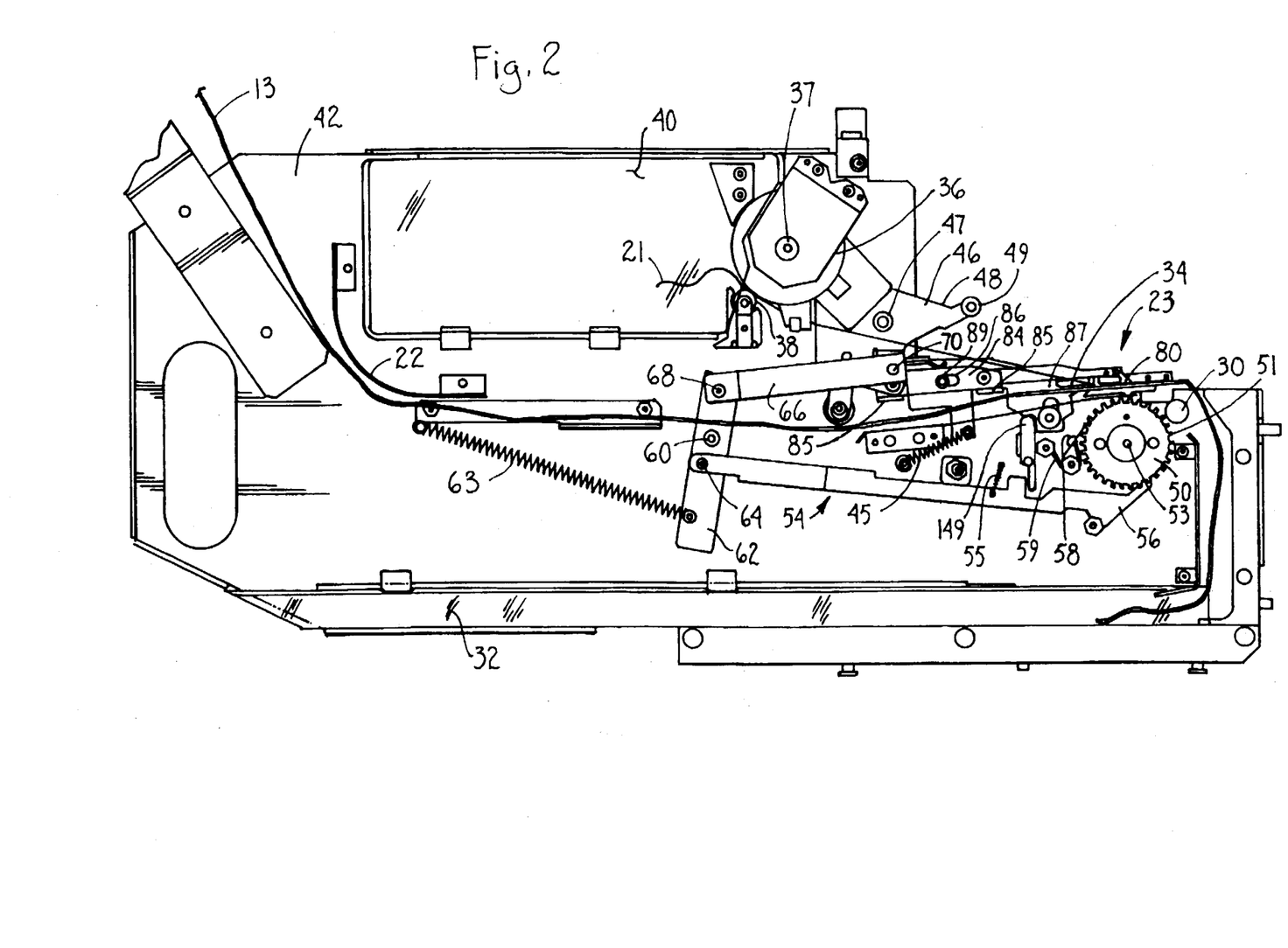
FIG. 2 is a side elevation view illustrating the preferred embodiment of the tape feeder illustrated in FIG. 1.
Figures 3, 4, 5:
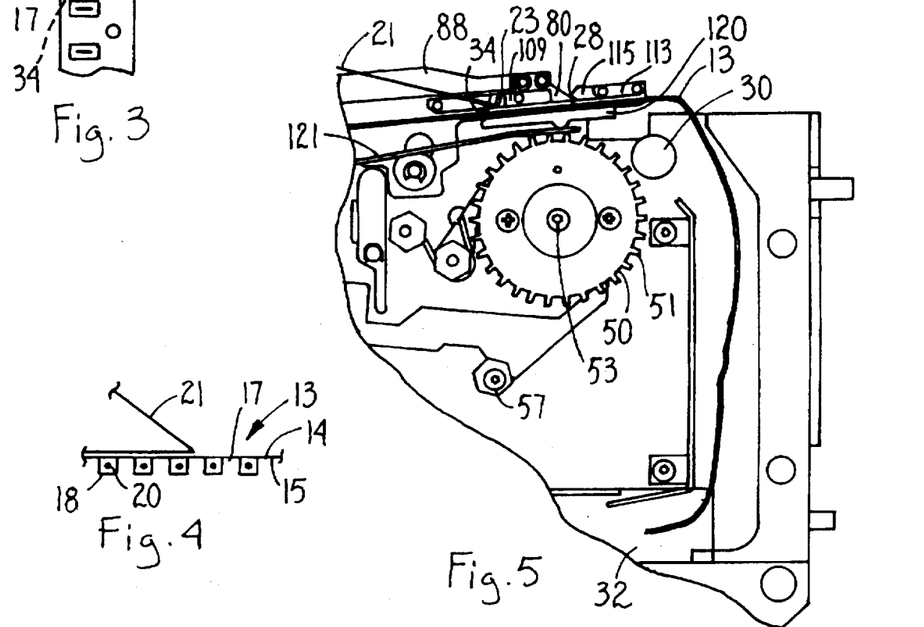
FIG. 3 is a top, plan view of a fragment of carrier tape.
FIG. 4 is a side elevation view, partly schematic, of the fragment of carrier tape shown in FIG. 3 with a cover tape partially removed therefrom.
FIG. 5 is an enlarged, partial side elevation view of the preferred embodiment of the tape feeder illustrating elements of the invention in the vicinity of a pick location.

With reference to the figures wherein like reference numeral indicate the same parts, there is shown, particularly in FIGS. 1–4 a tape feeder 10 that includes a feed reel 12 on which a carrier tape 13 is reeled. As best seen in FIGS. 3 and 4, the carrier tape 13 includes a top surface 14, a bottom surface 15, and two edges 16 and 17. Pockets are formed in the carrier tape 13 for cradling parts. The pockets are arranged in a sequence between the edges 16 and 17. One of the pockets is indicated by reference numeral 18. A sequence of sprocket holes, one indicated by reference numeral 19, is in the carrier tape 13 between the edge 17 and the sequence of pockets. Each pocket contains a part, one of which is indicated by reference numeral 20 in pocket 18. For storage, transport, and initial feed, the parts are retained in the pockets by a cover tape 21 applied to the top surface 14. As best seen in FIGS. 1 and 2, during operation the tape feeder 10 grasps and intermittently advances the tape 13 along a curved tape guide 22 past a first location 23 where the cover tape 21 is peeled from the top surface 14 of the carrier tape 13. Following this location, the feeder transports the carrier tape without the cover tape to and through a pick location 28 where the tip of a vacuum quill picks a part from a pocket. As the carrier tape 13 advances, now with empty pockets, it is fed over a stationary guide 30 downwardly to a bottom waste tape guide 32 whence the empty portion of the carrier tape 13 emerges for collection.

A stationary peel blade 34 is positioned at the peel location 23. The peeled cover tape 21 is tensioned at the thin edge of the peel blade 34 by being advanced between a stripper wheel 36 and pinch roller 38. The stripper wheel 36 rotates intermittently on a clutch assembly, the hub of which is indicated by reference numeral 37. The peeled cover tape 21 is received in a catch box 40; from there, it can be removed and disposed of.

The tape feeder 10 includes a frame 42 of sheet metal to which the feed reel 12, curved tape guide 22, stationary guide 30, waste guide 32, stripper wheel 36, pinch roller 38, and catch box 40, and the parts and elements to now be described are mounted. In this regard, an actuator lever 46 is pivoted at 47 on the frame 42. The actuator lever 46 includes an actuator arm 48 with a roller 49 against which an actuator of an SMPS is driven to operate the tape feeder 10. The actuator lever 46 has two positions, the first of which is shown in FIGS. 1 and 2, the second of which will be illustrated and explained in detail in the description which follows. The clutch assembly of the stripper wheel 36, a sprocket wheel linkage, and a shutter linkage are all interlinked by the actuator lever 46, and are operated synchronously in response to reciprocation of the lever 46 between the two positions.

The carrier tape 13 is advanced intermittently by a sprocket wheel 50 having teeth, one of which is indicated by 51. As best seen in FIGS. 7 and 8A-8D, a ratchet wheel 52 of a smaller diameter than the sprocket wheel 50 is mounted to the back of the sprocket wheel 50 so as to be disposed between the frame 42 and the sprocket wheel 50. The sprocket wheel 50 and ratchet wheel 52 rotate together on the axle 53. A sprocket linkage 54 engages the ratchet wheel 52 to rotate the sprocket wheel 50 (clockwise, in the preferred embodiment). The sprocket linkage 54 includes a ratchet link 56 that engages teeth of the ratchet wheel 52. A spring 55 biases the ratchet link 56 against the ratchet wheel 52. A pawl 58 is biased by a spring 59 against the teeth of the ratchet wheel 52 to prevent counter clockwise rotation of the ratchet wheel 52 and sprocket wheel 50. The sprocket linkage 54 includes a first sprocket linkage pivot 60 on which a first sprocket linkage arm 62 pivots. A main spring 63 biases the first sprocket linkage arm in a clockwise direction, returning the first sprocket linkage arm 62 to the position shown in FIGS. 2 and 8A. The ratchet link 56 is connected to the first sprocket linkage arm 62 by a second sprocket linkage pivot. The top end of the first sprocket linkage arm 62 is connected to a second sprocket linkage arm 66 by a third sprocket linkage pivot 68. A third pivot 70 connects an end of the second sprocket linkage arm 66 to the actuator lever 46. This connection is illustrated in FIG. 9, where the actuator lever 46 is shown in a front elevation view that displays a flange 73 extending outwardly from the actuator lever 46 to receive the fourth sprocket linkage pivot 70 for imparting movement to the sprocket linkage 54 by way of the second sprocket linkage arm 66. FIGS. 1 and 2 show the sprocket linkage 54, including the ratchet link 56, in its fully retracted position, having rotated the sprocket wheel by a predetermined amount equivalent to one pitch.

The ratchet link 56 is stopped by a ratchet link stop 57 that prevents the main spring 63 from pulling the sprocket linkage 54 any further in the clockwise direction. This stop also establishes, by virtue of the interlock between the actuator lever 46 and the sprocket linkage 54, the first position of the actuator lever 46, to which the lever 46 is returned by the main spring 63.

Figure 6A:
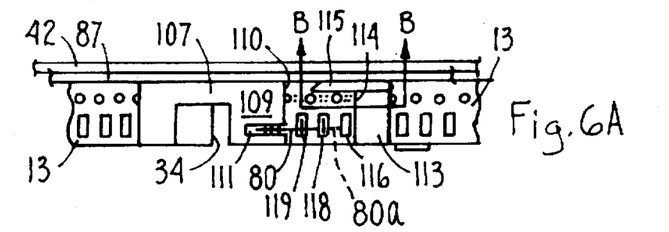
FIG. 6A is a top plan view of the enlarged section illustrated in FIG. 5.
Figure 6B:
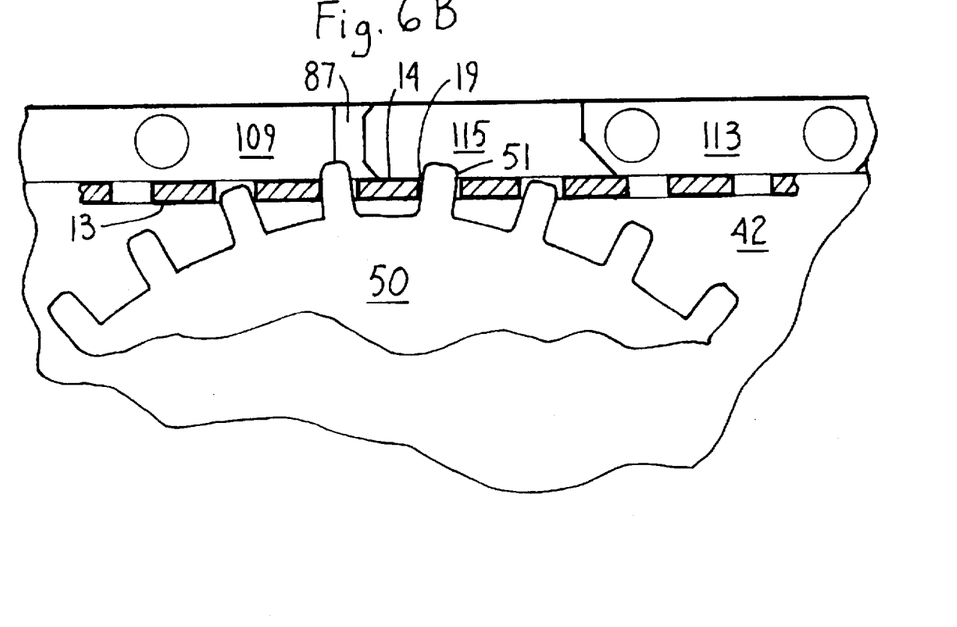
FIG. 6B is an enlarged, partially schematic, side sectional view taken along B—B in FIG. 6A.
Figure 7:
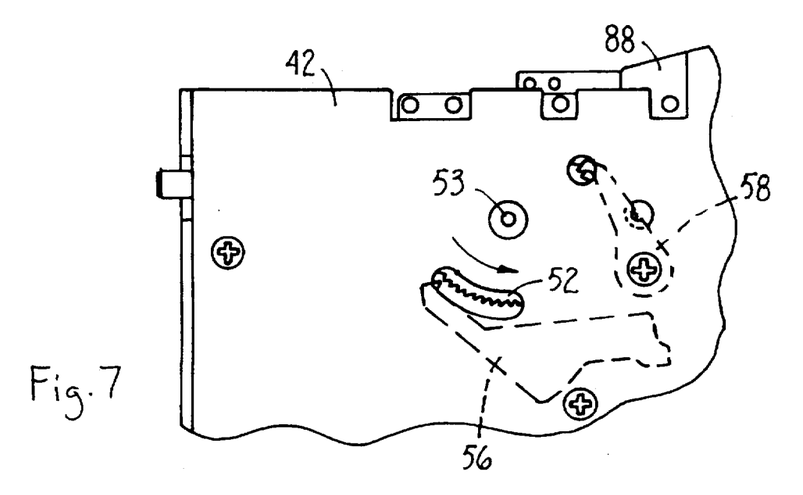
FIG. 7 is partial side elevation view of the back of the side section illustrated in FIG. 5.

A shutter 80 comprising a thin blade is moved by a reciprocateable shutter linkage 82 that includes a shutter slide 84 supported for sliding movement on a pair of flanges 85, each flange being positioned underneath a respective end of the shutter slide 84. The flanges 85 are on a secondary plate 87 that is sandwiched between the frame 42 and the shutter linkage 82, as best seen in FIGS. 6A and 6B. A slide slot 86 that opens through the shutter slide 84 provides clearance for a spring post 89, that constrains a compression spring that presses against the shutter slide 84. This spring holds the shutter slide 84 against the secondary plate 87, yet allows the shutter slide to reciprocate. A shutter arm 88 is fixed to the shutter slide 84. The shutter 80 is mounted to the forward end of the shutter arm 88. As best seen in FIGS. 8A–8D, which illustrate feeder actuation, and in which elements of the sprocket linkage 54 have been removed for clarity, the shutter linkage further includes a first toggle link 90 connected at one end by a first toggle pivot 92 to an end of the shutter slide 84. A second end of the first toggle link 90 is connected at a second toggle pivot 93 to a second toggle link 94. The second end of the second toggle link 94 is connected at a third toggle pivot 97.

For driving the reciprocateable shutter linkage 82, there is provided on the actuator lever 46 a cam 99 having a first cam surface 101 and a second cam surface 103. A cam follower 105 rides up and down in the cam 99, engaging the cam surfaces 101 and 103 as described below. The cam follower 105 is mounted on the shutter linkage 82, coaxially with the second toggle pivot 93.

The peel blade 34 is a part of a peel blade assembly 107 that is best seen in FIGS. 5, 6A–6B and 8A–8D. The peel blade assembly 107 includes a rear top guide 109 having slot 111 within which the shutter 80 reciprocates. The peel blade assembly further includes a front tape guide 113 against whose rear edge 114, an empty pocket 116 is aligned. The next pocket 118 behind the pocket 116 is at the pick location, with a part in it ready to be picked by a vacuum quill (not shown). A retainer 115 is sandwiched between the plate 87 and the front top guide 113. The retainer 115 retains the edge 16 of the tape in a plane through which the teeth 51 of the sprocket wheel extend from the bottom surface upwardly through the top surface of the tape. As FIGS. 6A and 6 B show, the sprocket wheel 50 is disposed between the blade 80 and the retainer 115, its teeth 51 aligned with sprocket holes in the tape 13.

An important feature of this invention is provided therefore by the retainer 115. In its location near the edge 16, over the top surface 14, laterally of the shutter 80 and sprocket wheel 50, the retainer ensures that the sprocket holes 19 of the tape 13 are positively engaged with the teeth 51.

As is best seen in FIGS. 6A–6B and 8A–8B, once the cover tape 21 has been peeled away over the blade 34, a number of pockets in the carrier tape 13 are uncovered. The parts carried therein are protected by the rear top guide and the shutter 80 against the danger of dislodgement by vibration while the uncovered carrier tape travels during a return stroke of the feeder to the pick location. The shutter's location at the end of the return stroke is shown by the dashed line indicated by reference numeral 80a in FIG. 6A. However, after the tape has been advanced to place the next pocket at the pick location and the feeder begins a drive stroke for the SMPS to pick the part, the shutter 80 is withdrawn from over the pocket at the pick location, leaving the one part at risk from vibration. The shutter's location during the drive stroke is shown by the solid line in FIG. 6A indicated by reference numeral 80. This risk is eliminated by the action of the shutter linkage and by retention of the top surface of the tape by the retainer 115. Further, the other mechanisms of the feeder 10 impart no vibration during this action.

With more specificity in this regard, the parts in the uncovered portion of the carrier tape 13 under the projecting members of the peel blade assembly 107, including the rear top guide 109, are protected from dislodgement. From the forward edge 110 of the rear top guide 109 up to a distance of one pitch from the back edge 114 of the front top guide 113, the parts in the uncovered pockets are retained by the motion of the shutter 80 while the tape advances. Thus, as best seen in FIG. 6A, when the actuator lever 46 is returned to its first position, the shutter 80 moves in synchronism with the tape, from the slot 111, over and with the two uncovered pockets 118 and 119 as the pockets advance from the edge 110 toward the edge 114. When tape movement stops, these two pockets are covered by the shutter 80. When the actuator lever 46 begins a drive stroke, cam-driven movement smoothly withdraws the shutter 80 into the slot 111 without positive stopping, uncovering the pocket 118 in the pick location and exposing the part therein for picking. The shutter, however, still covers the pocket 119, with its part.

Another important feature of this invention, therefore is the reduction or elimination of vibration in the portion of the tape with a pocket at the pick location by the smooth, vibration-free action of the shutter linkage 82 when the shutter 80 is moved rearwardly into the slot 111 to expose the pocket at the pick location so its part may be engaged by a vacuum quill. The retainer 115 contributes to the steadying of this portion of the carrier tape by retaining the portion in the plane through which the teeth of the sprocket wheel extend.

As seen in FIG. 5, the tape 13 in its uncovered portion is urged by a support block 120 biased by a support block spring 121 against the bottom surfaces of the rear top guide 109 and the front top guide 113 and against the lower edge of the retainer 115 and the shutter 80. The flexibility of the support block spring 121 enables the support block 120 to accommodate varying thicknesses of tape. The operation of the tape feeder in peeling, advancing tape, and controlling the shutter will now be explained with reference to FIGS. 8A–8D. These are schematic representations of the tape feeder in which elements already described are shown in their working arrangements. Some elements are not included in these figures in order to more clearly illustrate the operation of elements that would otherwise be hidden. However, the operation of the omitted elements can be appreciated by reference to FIGS. 1 and 2. In addition, hidden lines are not extensively employed in FIGS. 8A–8D to show overlapping, it being understood that the skilled artisan is fully able to appreciate the three-dimensional relationships of the pictured elements by reference to FIGS. 1 and 2.

Figure 8A:
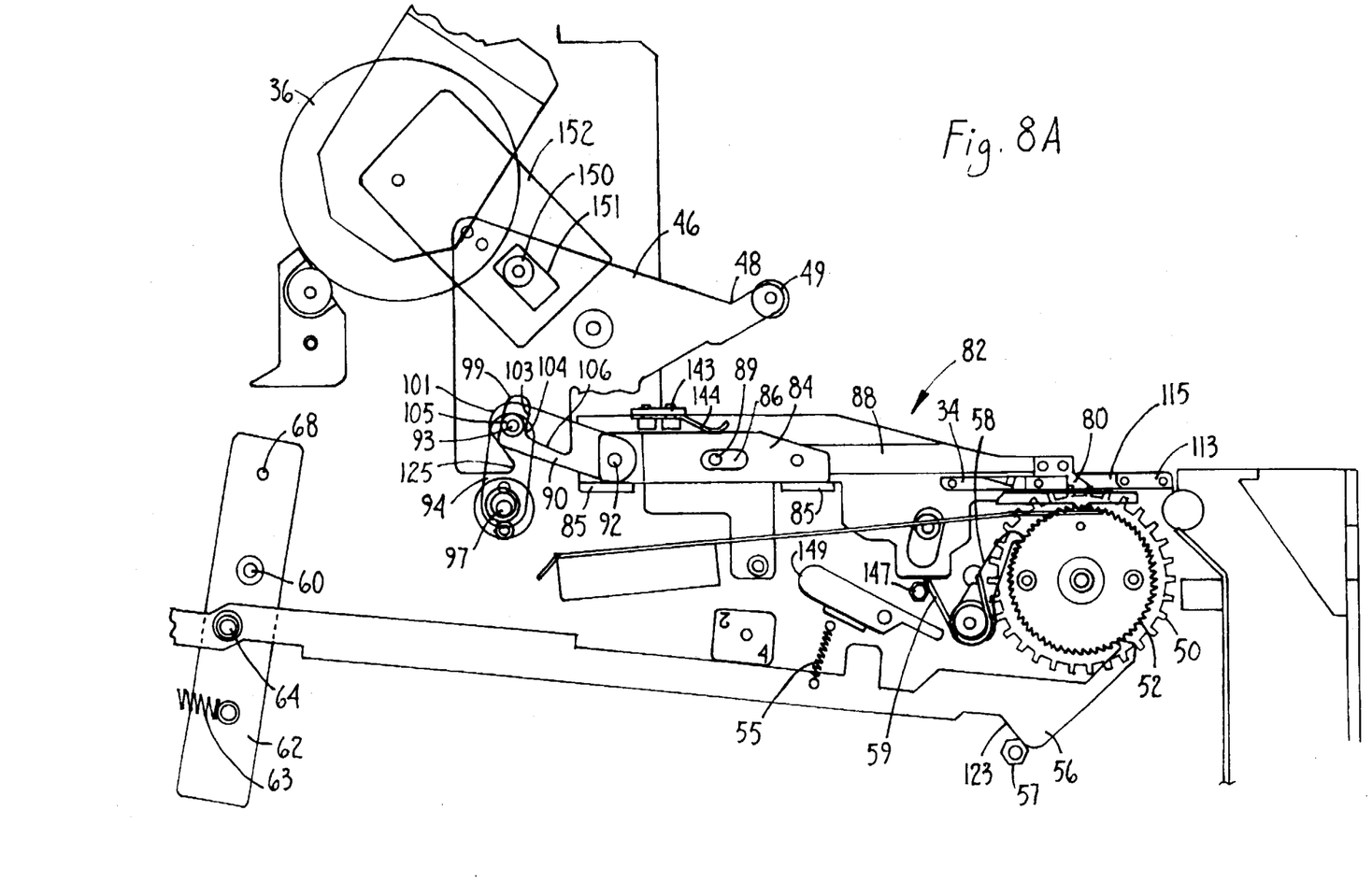
FIGS. 8A-8D are side, partial schematic illustrations of a cam and cam follower that cooperate to reciprocate the shutter of the tape feeder.
Figure 9:
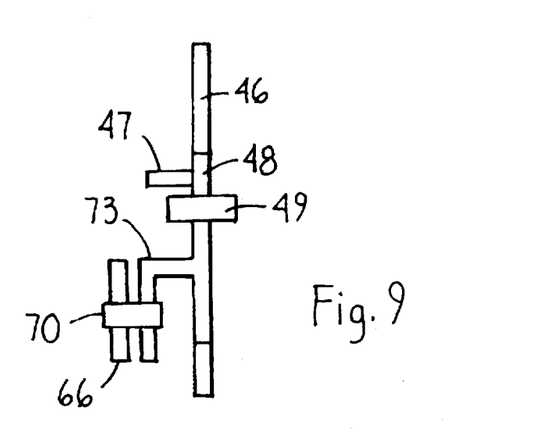
FIG. 9 is a front elevational view of an actuator lever.

In operation, the first (starting) position for the actuator lever is shown in FIG. 8A. The actuator lever is retained in this position by the bias imparted to the sprocket linkage 54 by the main spring 63. The pivoting action exerted by the spring 63 against the first sprocket linkage arm 62 is stopped by the ratchet link stop 57 when it contacts the lower edge 123 of the ratchet link 56. In this first position, the ratchet link 56 is engaged with the teeth of the ratchet wheel 52. At the first position of the actuator lever 46, the cam follower 105 is received in the cam 99 between the 101 and 103. At this position of the cam follower, the shutter 80 is thrust forward to the position illustrated in FIG. 6 where it covers the rear most of the three uncovered pockets, its tip positioned just at the trailing edge of the middle uncovered pocket. In addition, a cam follower 150 on the actuator lever 46 is retained in a slot 151 of a clutch actuator 152 that operates the clutch assembly of the stripper wheel 36. As the actuator lever 46 begins to rotate clockwise, the clutch actuator 152 begins to move with the lever 46, counterclockwise, without engaging the clutch. The stripper wheel 36 is, therefore, stationary.

Figure 8B:
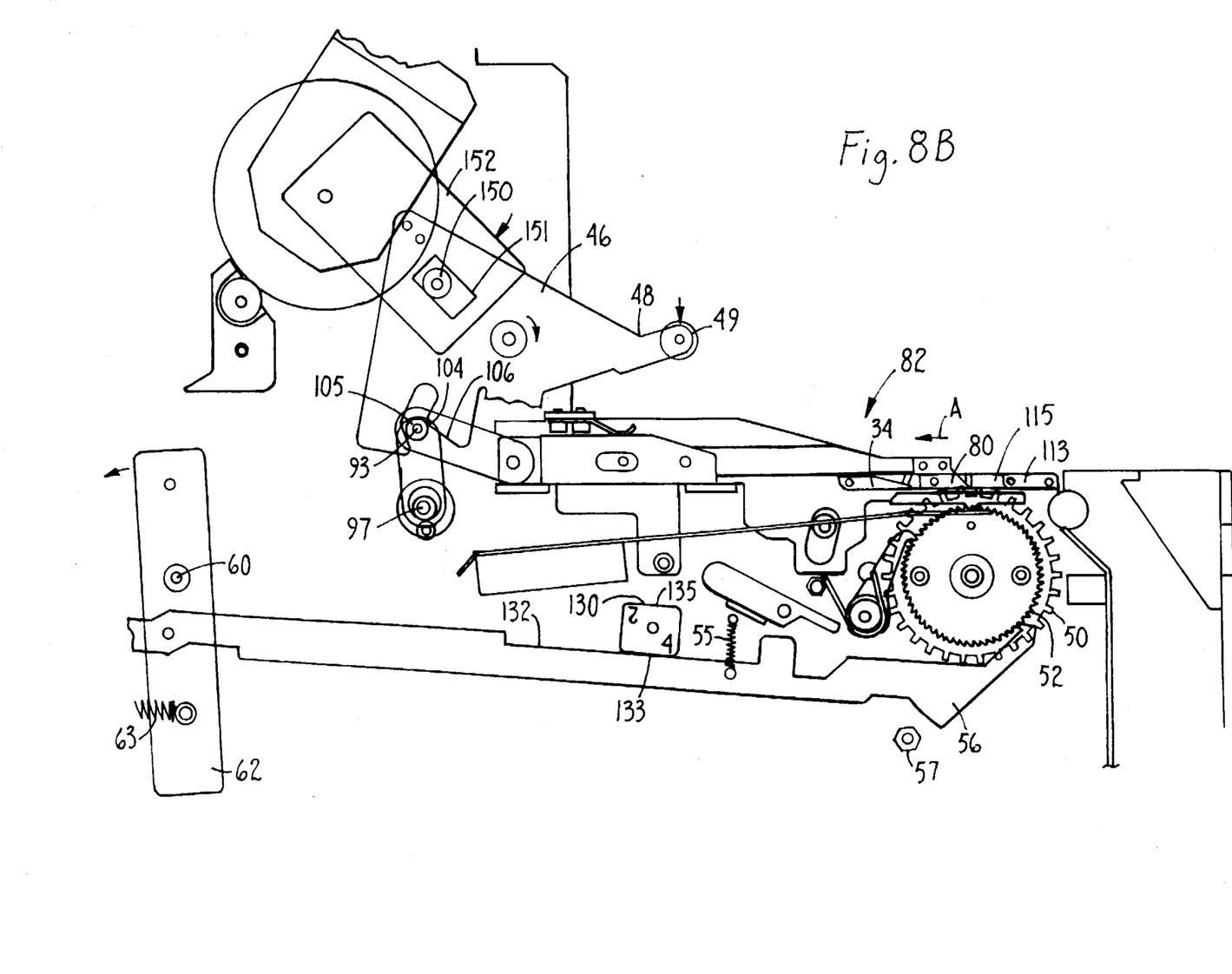

In FIG. 8B, force is exerted against the roller 49 on the actuator arm 48, moving it in a drive stroke from the first position toward a second position. Such force would be imparted, for example, by an actuator on an SMPS. In response to the force, the actuator lever 46 begins to rotate clockwise, thereby engaging the cam roller 105 with the cam surface 103 against which the cam follower 105 rides downwardly until it rolls off the lobe 104 onto the cam surface 106. When the surface 106 is encountered as the actuator lever 46 nears its second position, the cam follower 105 is retained in a retracted position against which it is biased by a spring (not shown) acting on the pivot 97. This spring also serves to maintain the first and second toggle links in alignment. The cam action provides a smooth, shock-free opening of the shutter 80, drawing it rearwardly in the direction of the arrow A in FIG. 8B. None of the shutter linkage comes in contact with a mechanical stop to limit the shutter travel. This action is important to prevent a part from being jostled out of the exposed pocket at the pick location and to allow the tape feeder 10 to actuate as quickly as possible.

The clockwise motion of the actuator lever 46 in moving from the first position to the second position is coupled to the sprocket linkage 54 that is interlocked with the actuator lever 46 as described above. Although several elements of the sprocket linkage 54 have been eliminated in FIGS. 8A–8D, it will be apparent to the skilled artisan that, in FIG. 8B, with the actuator lever 46 rotated in the clockwise direction as shown, the sprocket linkage will cause the first sprocket linkage arm 62 to rotate in a counterclockwise direction on the pivot 60. This causes the ratchet link 56 to move upwardly and to the right off of the ratchet link stop 57. The ratchet link moves upwardly until the top edge 132 of the ratchet link 56 contacts a feed pitch selector 130 having two edges, 133 and 135, respectively. During the motion illustrated in FIG. 8B, the top edge 132 of the ratchet link 56 has come into contact with the surface 133 of the feed pitch selector 130. Further rotation of the first sprocket linkage arm 62 in the counterclockwise direction will now simply translate the tip of the ratchet link 56 to the right. However, the location of the first edge 133 of the feed pitch selector 130 keeps the ratchet link 56 a proper position to correctly engage the ratchet wheel 52 for rotation of the sprocket wheel 50 through an arc that will advance the carrier tape by one pitch when the actuator lever 46 rotates counterclockwise back to its first position.

Figure 8C:
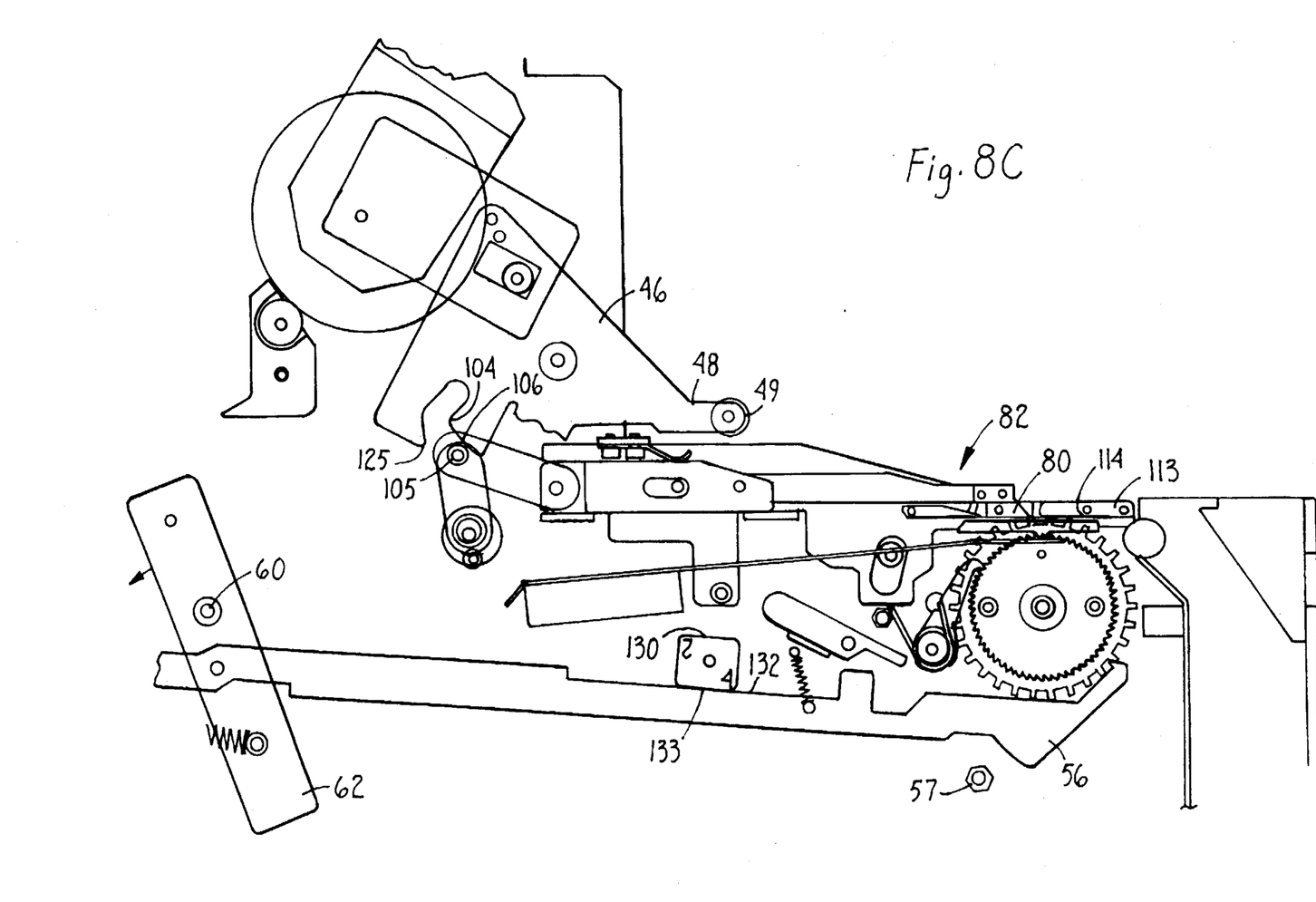
Figure 8D:
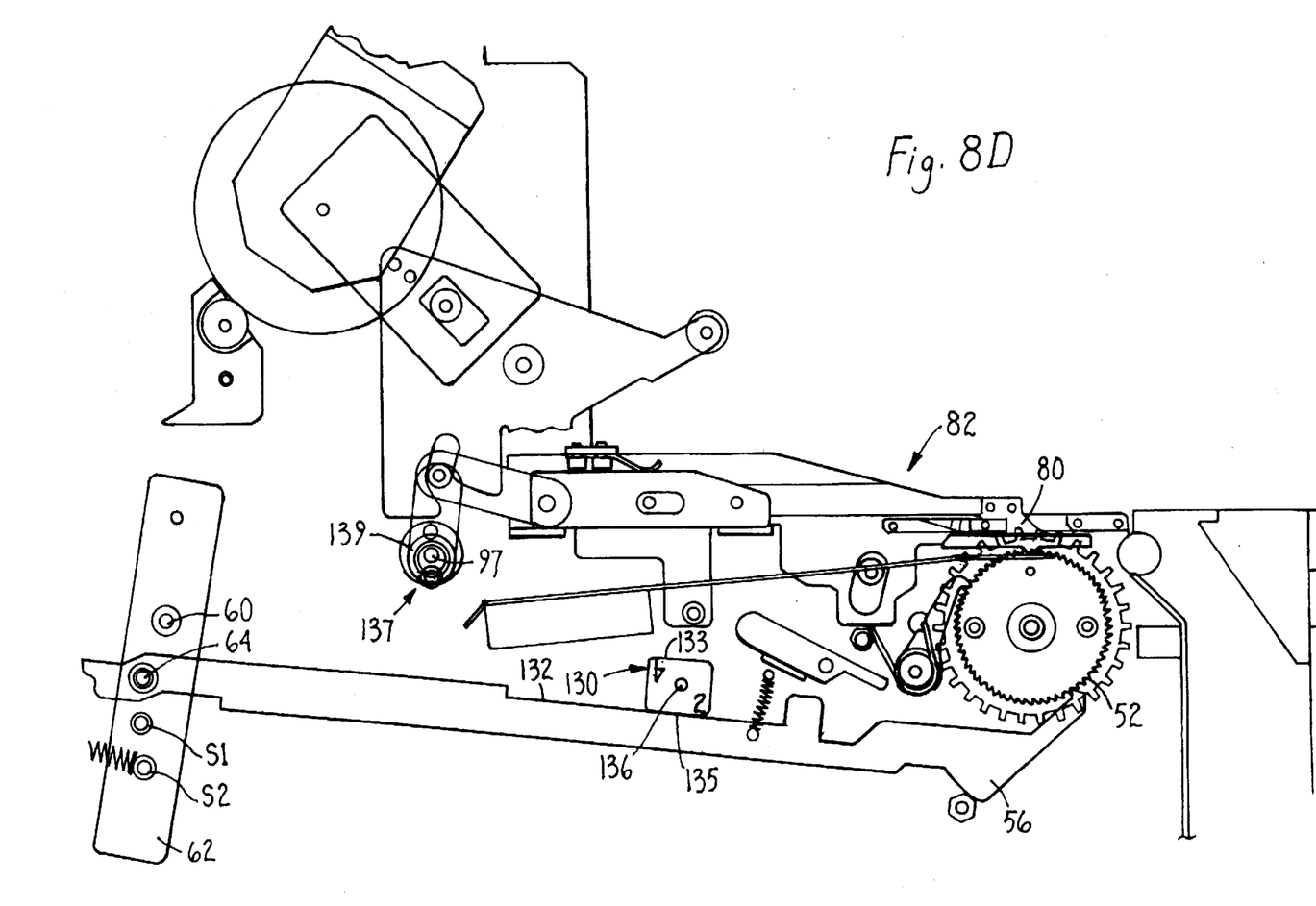

As shown in FIG. 8C, after the cam follower 105 has rolled off the lobe 104 onto the surface 106, it rides on the circular surface 106. As consequence, the shutter 80 is stationary for a period of time allowing the vacuum nozzle of the SMPS to travel downward and pick the part at the pick location (in pocket 118) without further shutter travel. At the same time, the ratchet link 56 is now fully extended. In addition, the clutch actuator 152 continues to rotate in the counterclockwise direction without engaging the clutch of the stripper wheel 36.

From the second position, shown in FIG. 8C, the actuator lever 46 rotates in a counter clockwise direction (the return stroke) back to the first position illustrated in FIG. 8A when the SMPS actuator lifts off of the roller 49 in its return stroke. On the return stroke, as the actuator lever 46 rotates counterclockwise, the carrier tape is advanced by one pitch, the shutter is advanced by 4 mm (except as explained below), retaining the part in an uncovered pocket as the pocket moves from under the rear top guide 109 (FIG. 6), and the stripper wheel 36 rotates, maintaining tension on the cover tape over the thin edge of the peel blade 34 while feeding stripped cover tape into the catch box 40. In this regard, referring to FIGS. 8C and 8A, as the actuator lever 46 rotates in the counterclockwise direction, the cam follower 105 is engaged by the lobe 125 and rolled up the cam surface 101, driving the shutter linkage forward, and moving the shutter 80 out of the slot 111. The return stroke of the actuator lever 46 synchronizes advancement of carrier tape with the movement of the shutter 80 by virtue of the interlock between the actuator lever 46 and the sprocket linkage 54. In this regard, with withdrawal of the SMPS actuator from the roller 49, the main spring 63 rotates the first sprocket linkage arm 62 in the clockwise direction, thereby providing the return stroke force to the actuator arm 46. As the first sprocket linkage arm 62 is rotated clockwise by the main spring 63, the ratchet link 56 is drawn to the left, eventually engaging a tooth of the ratchet 52 and rotating the sprocket wheel 50 until stopped by the ratchet link stop 57. The number of ratchet teeth by which the ratchet link advances on the ratchet wheel 52 is determined by the upward distance it travels during the downward stroke of the actuator lever 46, which is limited by the location of the first edge 133 (or second edge 135) of the feed pitch selector 130. The geometric relationships between the ratchet 52 and the sprocket wheel 50 ensure that the ratchet link 56 advances the sprocket wheel 50 in the clockwise direction through an arc that moves the carrier tape by one pitch.

On the return stroke, the cam 150 drives the clutch actuator 152 in the clockwise direction, which engages the clutch assembly of the stripper wheel 36, rotating the stripper wheel 36 clockwise to maintain tension on the peeled cover tape and advance the peeled cover tape between the stripper wheel 36 and the pinch roller 38 into the catch box 40.

In order to accommodate a different pitch of tape, (for example, a 2 mm pitch on an 8 mm tape), two means are provided in the invention. The first means adjusts the stroke of the ratchet link 56 to change the amount by which the carrier tape is advanced to one of at least two pitches. This means is embodied in the feed pitch selector 130, which has a first edge 133 and a second edge 135. The feed pitch selector 130 is rotatable on an axis 136 to a first locked position in which the first edge 133 faces the edge 132 of the ratchet link 56. This position is shown in FIGS. 8A–8C. The feed pitch selector 130 is also rotatable to a second locked position, illustrated in FIG. 8D, to place the second edge 135 against the edge 132 of the ratchet link 56. The distance between the pivot 136 and the edge 133 is less than the distance between the pivot 136 and the edge 135. Thus, with the feed pitch selector 130 set at the position illustrated in FIGS. 8A–8C, the tip of the ratchet link 56 travels a relatively greater distance upwardly toward the ratchet 52 thereby advancing by a greater number of teeth on the ratchet 52 than when the second edge 135 of the feed pitch selector 130 faces the edge 132 of the ratchet link 56. The distances between the pivot 136 and the edges 133 and 135 are established with respect to the diameter of the ratchet 52, the diameter of the sprocket wheel 50, and the pitches of the ratchet teeth and sprocket wheel teeth to ensure that the sprocket wheel advances through a first arc equivalent to a first pitch distance that moves a carrier tape by a first pitch, or second arc equivalent to a second pitch distance that moves a carrier tape by a second pitch.

It should be noted that the ratchet link 56 can also have its stroke line grossly adjusted by having the location of its pivot point 64 on the first sprocket linkage arm 62 relocated.

For this purpose, additional studs $S_1$ and $S_2$ are provided. $S_1$ lengthens the stroke length for a 8 mm pitch, while $S_2$ provides a stroke length for a 12 mm pitch.

To accommodate different pitches, the second means changes the position of the cam follower 105 with respect to the cam surfaces 101 and 103, thereby to adjust the stroke of the shutter 80. In this regard, with reference to FIGS. 8A and 8D, the second means is embodied in a shutter stroke selector 137 comprising a rotatable piece 139 that may be rotated to either of two locked positions. In the first position (FIG. 8A) the shutter travels 4 mm each time the tape advances, and returns the same distance. In the second position, the shutters travel 2 mm with the tape, and returns the same distance. This sole activity is provided by action of the piece 139. The rotatable piece 139 carries with it the third toggle pivot 97, adjusting the location of the third toggle pivot at a first location illustrated in FIG. 8A or second position illustrated in FIG. 8D. In the first position illustrated in FIG. 8A, the cam follower 105 is positioned more deeply (higher) in the cam 99 than in FIG. 8D. In FIG. 8A, as the actuator lever 46 rotates clockwise and the shutter 80 moves, the total travel of the cam follower 105 and therefore of the shutter will be relatively greater than in FIG. 8D because the cam follower 105 travels a longer distance before it reaches the lobe 104 and then rolls against the circular surface portion 106.

One other feature of the tape feeder of this invention can be appreciated with reference to FIGS. 2, 5, and 8A–8D. In this regard, much of the shutter linkage 82, all of the peel blade assembly 107, and the retainer 115 are carried on the secondary plate 87. The secondary plate 87 includes a retainer 143 with a spring member 144 that urges the shutter slide 84 against the flanges 85. The secondary plate 87 is rotatable on a pivot that is behind and coaxial with the first toggle pivot 92, and is biased by the spring 145 downwardly against the stop 147. When manually rotated upwardly, the secondary support plate 87 can be retained in a tape threading position by the latch 149. FIGS. 2 and 5 show the secondary plate in this position, which allows threading of the carrier tape on the sprocket wheel 50 and threading of the peeled cover tape between the stripper wheel 36 and pinch roller 38. With the tape thus initialized, the latch can be rotated to the position shown in FIGS. 8A–8D, whereupon the spring 145 returns the secondary plate to its tape advance position in which the teeth of the sprocket wheel 50 will engage the sprocket holes of the tape and prepare the tape feeder for operation.

It should be obvious that a new and improved tape feeder for a surface mount placement system has been described in an embodiment that can be readily adapted and modified by those skilled in the art without departing from the scope of the invention.

We claim:

1. A tape feeder operable in a surface mount placement system for providing parts contained in a tape with two edges, a top surface and a bottom surface, and a sequence of pockets for carrying the parts, the tape feeder comprising:

an actuating lever reciprocateable between two positions;

a cam with two surfaces on the actuating lever;

a sprocket wheel with teeth for engaging the bottom surface;

a first reciprocateable linkage with a ratchet link in driving engagement with the sprocket wheel, the first linkage interlocked with the actuating lever for rotating the sprocket wheel to advance the tape when the actuating lever is moved to a first position;

a shutter for contacting the top surface of the tape to retain a part in a pocket;

a second reciprocateable linkage interlocked with the actuating lever, the second linkage including a cam follower for being engaged by a first cam surface to move the shutter in a first direction with the tape when the actuating lever is moved to the first position, and for being engaged by the second cam surface to move the shutter in a second direction opposite to the first direction when the actuating lever is moved to the second position; and a member disposed laterally of the shutter, above an edge of the tape, for contacting a portion of the top surface to retain the portion of the top surface in a plane when the tape is engaged by the sprocket wheel.

2. The tape feeder of claim 1, wherein the sprocket wheel is disposed between the shutter and the member.

3. The tape feeder of claim 2, wherein the teeth of the sprocket wheel are for engaging tape sprocket holes.

4. The tape feeder of claim 1, further including:

first means in engagement with the ratchet link to cause the ratchet link to rotate the sprocket wheel by a pitch distance; and second means in engagement with the cam follower to cause the cam follower to move the shutter by said pitch distance.

5. The tape feeder of claim 4, wherein the ratchet link is an elongate arm with a pivot on the first linkage and an edge, the pivot causing the elongate arm to pivot toward and away from the sprocket wheel, and the first means includes a stop for limiting an amount by which the elongate arm pivots toward the sprocket wheel.

6. The tape feeder of claim 4, wherein the cam follower is carried on a linkage arm with two ends, a first end carrying the cam follower and a second end pivoted at a point, the second means including a piece to which the second end is pivoted, the piece moveable to change the location of the point.

7. The tape feeder of claim 1, further including means for removing a cover tape.

8. The tape feeder of claim 7, wherein the means is interlocked with the actuating lever.

9. A tape feeder for advancing a carrier tape in a surface mount placement system (SMPS), the carrier tape including top and bottom surfaces, two edges, a sequence of pockets spaced at a predetermined pitch, a sequence of sprocket holes, and a cover tape on the surface the tape feeder comprising:

means for removing the cover tape from the top surface at a first location;

a rotatable sprocket wheel for engaging the sprocket holes;

a first linkage coupled to the sprocket wheel for intermittently advancing the carrier tape by a predetermined pitch by rotating the sprocket wheel by a predetermined amount;

a shutter disposed over the pockets;

a second linkage coupled to the shutter for advancing the shutter with the carrier tape by the predetermined pitch from near said first location toward a pick location, and for returning the shutter toward the first location;

an actuating lever interlinking the means for removing, the first linkage, and the second linkage, and responsive to an actuating force applied from the SMPS for synchronizing removal of the cover tape with rotation of the sprocket wheel and movement of the shutter; and a retainer disposed laterally of the shutter for contacting the top surface of the tape near a first edge of the tape and extending along the first edge for a distance of at least one pitch.

10. The tape feeder of claim 9, wherein:

the first linkage is a first reciprocateable linkage with a ratchet link in driving engagement with the sprocket wheel, the first linkage interlocked with the actuating lever for rotating the sprocket wheel to advance the tape when the actuating lever is moved to a first position.

11. The tape feeder of claim 10, further including a means in engagement with the ratchet link to cause the ratchet link to rotate the sprocket wheel by a pitch distance.

12. The tape feeder of claim 11, wherein the ratchet link is an elongate arm with a pivot and an edge, the pivot causing the elongate arm to pivot toward and away from the sprocket wheel, and the means includes a stop for limiting an amount by which the elongate arm pivots towards the sprocket wheel.

13. The tape feeder of claim 9, wherein the actuating lever includes a cam and the second linkage includes a cam follower for being engaged by the cam to move the shutter in a first direction with the tape when the actuating lever is moved to a first position, and for being engaged by the cam to move the shutter in a second direction opposite to the first direction when the actuating lever is moved to a second position.

14. The tape feeder of claim 13, further including:

a means in engagement with the cam follower to cause the cam follower to move the shutter by a pitch distance.

15. The tape feeder of claim 14, wherein the cam follower is carried on a linkage arm with two ends, a first end carrying the cam follower and a second end pivoted at a point, the second means including a piece to which the second end is pivoted, the piece moveable to change the location of the point.

16. The tape feeder of claim 15, wherein the first linkage is a reciprocateable linkage with a ratchet link in driving engagement with the sprocket wheel, the first linkage interlocked with the actuating lever for rotating the sprocket wheel to advance the tape when the actuating lever is moved to a first position.

17. The tape feeder of claim 16, further including:

a means in engagement with the ratchet link to cause the ratchet link to rotate the sprocket wheel by a pitch distance.

18. The tape feeder of claim 17, wherein the ratchet link is an elongate arm with a pivot on the first linkage and an edge, the pivot causing the elongate arm to pivot toward and away from the sprocket wheel, and the means in engagement with the ratchet link includes a stop for limiting an amount by which the elongate arm pivots towards the sprocket wheel.

19. The tape feeder of claim 9, wherein the sprocket wheel is disposed between the shutter and the retainer.

20. The tape feeder of claim 19, wherein the sprocket wheel engages the sprocket holes from the bottom surface.

21. The tape feeder of claim 20, wherein teeth of the sprocket wheel that engage sprocket holes extend through the tape from the bottom surface upwardly through the top surface.

22. The tape feeder of claim 9, wherein the retainer is disposed laterally of the shutter.

* * * * *